(12) United States Patent
Maneatis

(10) Patent No.: US 6,462,527 B1
(45) Date of Patent: Oct. 8, 2002

(54) PROGRAMMABLE CURRENT MIRROR

(75) Inventor: John George Maneatis, Redwood City, CA (US)

(73) Assignee: True Circuits, Inc., Los Altos, CA (US)

( * ) Notice: Subject to any disclaimer, the term of this patent is extended or adjusted under 35 U.S.C. 154(b) by 0 days.

(21) Appl. No.: 10/059,912

(22) Filed: Jan. 28, 2002

Related U.S. Application Data

(60) Provisional application No. 60/264,563, filed on Jan. 26, 2001, provisional application No. 60/264,628, filed on Jan. 26, 2001, provisional application No. 60/266,009, filed on Feb. 2, 2001, provisional application No. 60/316,702, filed on Aug. 31, 2001, and provisional application No. 60/316,703, filed on Aug. 31, 2001.

(51) Int. Cl.[7] .............................. G05F 3/16; G05F 3/20
(52) U.S. Cl. ........................................ 323/315; 323/313
(58) Field of Search ................................ 323/312, 313, 323/315, 319

(56) References Cited

U.S. PATENT DOCUMENTS

| | | |
|---|---|---|
| 4,065,506 A | 12/1977 | Wessendorf et al. .... 260/601 R |
| 4,423,387 A | 12/1983 | Sempel ......................... 330/85 |
| 4,608,530 A | 8/1986 | Bacrania ..................... 323/315 |
| 5,455,522 A * | 10/1995 | Jones .......................... 326/27 |
| 5,608,348 A * | 3/1997 | Kearney et al. ............ 327/538 |
| 6,236,238 B1 * | 5/2001 | Tanji et al. ................... 326/82 |

* cited by examiner

*Primary Examiner*—Bao Q. Vu
(74) *Attorney, Agent, or Firm*—Kolisch Hartwell Dickinson McCormack & Heuser

(57) ABSTRACT

A programmable current mirror, including a reference system configured to receive a reference current, and a mirror system operatively connected to the reference system and configured to produce an output current based on the applied reference current. The relationship between the reference current and the mirror current is defined by a programmably variable mirroring parameter. The reference system includes a plurality of transistor groups, each transistor group being configured to alter the mirroring parameter via programmable variation of a dimensional parameter associated with the transistor group. Variations to the mirroring parameter produced by one of the transistor groups are scaled relative to variations produced by another of the transistor groups. The reference system, mirror system or both may be implemented with a multistage configuration. The current mirror may also be configured to provide inverse linear programmability.

35 Claims, 8 Drawing Sheets

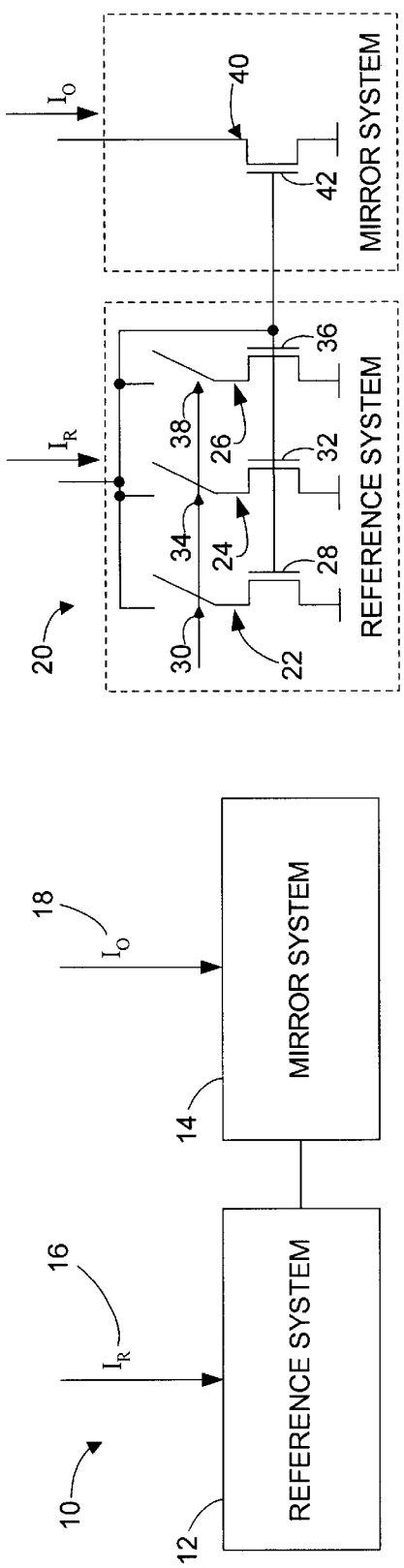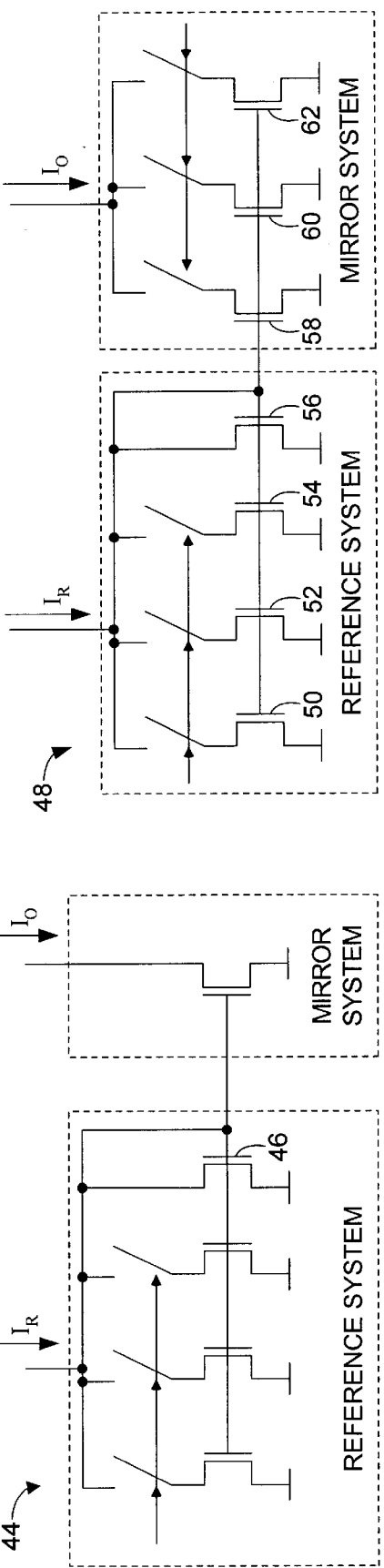

US 6,462,527 B1

PROGRAMMABLE CURRENT MIRROR

CROSS-REFERENCE TO RELATED APPLICATION

This application is based upon and claims priority under 35 U.S.C. §119 from the following co-pending U.S. provisional patent applications, each of which is incorporated herein by this reference, in its entirety and for all purposes: "Single-ended Zero Static Phase Offset Phase Locked Loops," Serial No. 60/264,563, filed Jan. 26, 2001; "Multistage Programmable Current Mirrors," Serial No. 60/264,628, filed Jan. 26, 2001; "Single-ended Zero Static Phase Offset Phase Locked Loops," Serial No. 60/266,009, filed Feb. 2, 2001; "Pseudo-differential Zero Static Phase Offset Phase Locked Loops," Serial No. 60/316,702, filed Aug. 31, 2001; and "Multistage Programmable Current Mirrors," Serial No. 60/316,703, filed Aug. 31, 2001.

TECHNICAL FIELD

The present invention relates to current mirrors, and more particularly to programmable current mirrors.

BACKGROUND OF THE INVENTION

Current mirrors are used widely in analog and electric circuit design. Simple current mirrors are configured to produce an output current ($I_O$) that is a fixed ratio of a reference current ($I_R$). The reference current is received by a reference transistor having an associated width-to-length ratio ($W_R$). The gate of the reference transistor is connected to the gate of a mirror transistor having a width-to-length ratio ($W_M$). The applied reference current determines the gate voltage arising at the reference transistor, which in turn is passed to the gate of the mirror transistor. The gate voltage on the mirror transistor in turn determines the magnitude of the output current drawn by the mirror transistor. In such an arrangement, the reference current and output current are related by the following:

$$I_0 = \frac{W_M}{W_R} \times I_R.$$

In general, the factor by which the reference current is multiplied (i.e., $W_M/W_R$) may be referred to as the mirroring parameter of the current mirror. Selecting a reference transistor and a mirror transistor with specific width-to-length ratios sets the mirroring parameter and thus the relationship between the reference and output current.

Post-design control over the mirroring parameter is possible through use of programmable current mirrors, which provide programmable variation of the ratio between the output current and the reference current. Typically, instead of a single transistor on the mirror (output) side, a programmable current mirror utilizes a linear array of mirror transistors wired in parallel and connected gate-to-gate. A switching mechanism is associated with one or more of the mirror transistors, in order to selectively activate and deactivate the transistor, and thereby control whether current is permitted to flow through the transistor. In such configurations, WM in the above equation becomes the sum of the individual width-to-length ratio(s) of the activated mirror transistors, such that operation of the switching mechanism allows for some degree of control over the mirroring parameter. Because the mirror transistors are coupled in parallel, the output current is the sum of the currents flowing through the individual activated mirror transistors.

It typically is desirable for a programmable current mirror design to provide a large range of operation and high resolution. A current mirror having a large range of operation is capable of a large range of programmable variation over the ratio of the output current to the reference current; while a current mirror with a high resolution is capable of making such variations in many small steps. Designing programmable current mirrors with high resolution and a large operational range while keeping the physical realization of the device small has proven to be particularly difficult. In order to increase resolution, previous designs have sacrificed range, while attempts to increase range have led to sacrifices in resolution. In many cases, attempts to improve performance in either or both of these areas has undesirably increased the physical realization of the circuit in existing current mirrors.

SUMMARY OF THE INVENTION

A programmable current mirror is provided. According to one aspect of the invention, the programmable current mirror includes a reference system configured to receive a reference current and a mirror system operatively connected to the reference system and configured to output an output current that is based on the reference current. The relationship between the reference current and the output current is described by a mirroring parameter. The reference system includes a plurality of transistor groups, each transistor group being configured to alter the mirroring parameter via programmable variation of a dimensional parameter associated with the transistor group. Variations to the mirroring parameter produced by one of the transistor groups are scaled relative to variations produced by another of the transistor groups. According to another aspect of the invention, the reference system and/or mirror system is provided with a multistage configuration. According to yet another aspect of the invention, the programmable current mirror is configured to provide inverse linear programmability.

BRIEF DESCRIPTION OF THE DRAWINGS

FIG. 1 is a block diagram of a programmable current mirror.

FIG. 2 depicts an inverse programmable current mirror.

FIG. 3 depicts another inverse programmable current mirror, having a non-programmable transistor leg.

FIG. 4 depicts a rational programmable current mirror.

DETAILED DESCRIPTION OF THE INVENTION

Figure 5:
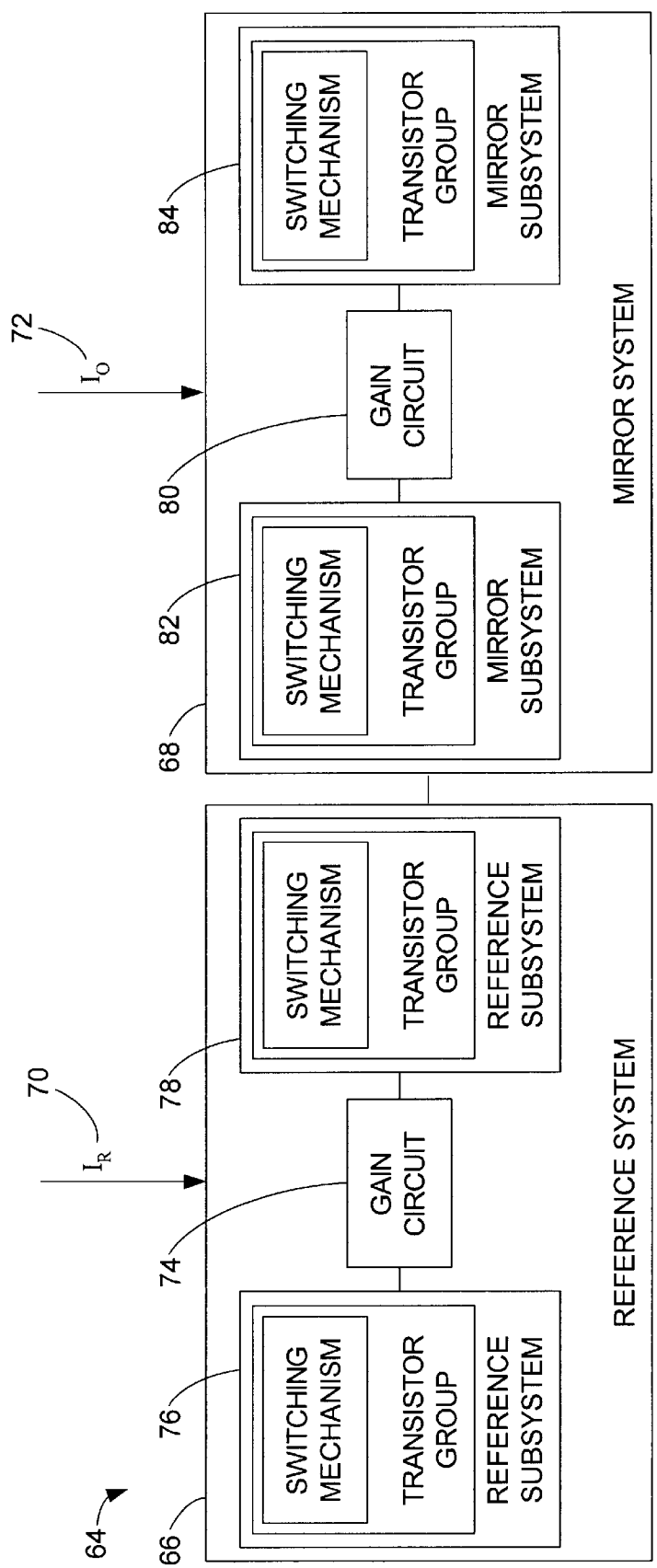
FIG. 5 is a block diagram of a multistage programmable current mirror according to the present invention.

FIG. 1 is a block diagram of current mirror 10. Current mirror 10 includes a reference system 12 and a mirror system 14. The reference system is configured to receive a reference current 16 ($I_R$). The mirror system is operatively connected to the reference system and is configured to produce an output current 18 ($I_O$) that is based on the reference current. The output current may be determined by the following equation, where M is the mirroring parameter of the current mirror:

$$I_O = M \times R_R$$

As indicated by the above equation, the magnitude of the output current is dependent upon the mirroring parameter and the magnitude of the reference current. Therefore, the relationship between the output current and the reference current is defined by the mirroring parameter. As will be described below with respect to various illustrative embodiments of the present invention, the mirroring parameter may be programmably varied to control the relationship between the reference current and output current.

Typically, the mirroring parameter is a quotient in which the dividend (i.e., numerator) is a dimensional parameter associated with the mirror system and the divisor (i.e., denominator) is a dimensional parameter associated with the reference system. The dimensional parameter associated with the reference system typically is defined by the width-to-length ratio(s) of transistor(s) included in the reference system. On the mirror (output) side of the system, the dimensional parameter typically is defined by the width-to-length ratio(s) of transistor(s) included in the mirror system. In most semiconductor processes, linear changes in transistor length typically do not produce corresponding linear changes in conducted current, and therefore the mirror and reference systems are usually configured with transistors of equivalent length. In such cases, the relative width-to-length ratio of a given transistor is determined by its width. In this setting, differing width-to-length ratios may be achieved by providing transistors of different widths or by combining different numbers of transistors having the same width.

In the current mirrors of the present invention, programmable variation of the mirroring parameter may be implemented by varying the dimensional parameter associated with the reference system, the dimensional parameter associated with the mirror system, or both. The nature of the programmability may be defined in terms of the particular way that the mirroring parameter is varied. As will be explained in more detail below, embodiments that alter the mirroring parameter through variation of only the mirror side dimensional parameter may be referred to as non-inverse programmable current mirrors. Embodiments configured to alter the mirroring parameter through variation of only the reference side dimensional parameter may be referred to as inverse programmable current mirrors. Where both the reference side and mirror side dimensional parameters are varied, the current mirror may be referred to as a rational programmable current mirror.

In the current mirrors of the present invention, the mirroring parameter may be increased by increasing the dimensional parameter associated with the mirror system and/or decreasing the dimensional parameter associated with the reference system. Similarly, the mirroring parameter may be decreased by increasing the dimensional parameter associated with the reference system and/or decreasing the dimensional parameter associated with the mirror system. Variations to either the reference side or mirror side dimensional parameter may be provided in linear increments. Embodiments providing linear increments to the reference side dimensional parameter may be referred to as providing inverse linear programmability, due to the linear variation occurring in the denominator of the mirroring parameter. Similarly, embodiments providing linear increments to the mirror side dimensional parameter are known as non-inverse linear programmable current mirrors, due to the linear variation occurring in the numerator of the mirroring parameter. Alternatively, either or both sides of the system may be configured to provide non-linear variations to the respective components of the mirroring parameter.

FIG. 2 shows an exemplary embodiment of an inverse programmable current mirror 20. Current mirror 20 is configured to vary the reference side dimensional parameter. As indicated, the reference system of current mirror 20 includes a transistor group having programmable transistor legs 22, 24, and 26, while the mirror system includes a fixed transistor leg 40. Transistor legs 22, 24 and 26 respectively include transistors 28, 32 and 36, while mirror side leg 40 includes transistor 42. The width-to-length ratio of each transistor typically defines the width-to-length ratio of the corresponding transistor leg. Throughout this specification, the width-to-length ratio of a transistor, and thus its corresponding transistor leg, is denoted by a capital W followed by the reference number of the transistor leg. For instance, the width-to-length ratio of transistor leg 22 is denoted as $W_{22}$. As explained below, transistor legs 22, 24 and 26 may be selectively activated and deactivated. However, it will be appreciated that when all three legs are activated, the reference side dimensional parameter is the sum of the width-to-length ratios of transistors 28, 32, and 36, due to the parallel coupling of the respective transistor legs. The dimensional parameter associated with the mirror system is the width-to-length ratio of transistor 42.

Programmable transistor legs 22, 24, and 26 respectively include switching mechanisms 30, 34, and 38. Typically, each switching mechanism is a switching transistor, although other suitable switching mechanisms may be used. The various switching mechanisms typically are controlled through application of a control word. In many implementations, the states of the individual switching mechanisms are controlled by a single bit within a multi-bit control word. Upon application of the control word, each switching mechanism either fully activates or deactivates the transistor leg associated with that switching mechanism. For example, a three-bit digital control word may be used to control the depicted system. Applying such a control word with a value of "010" to switching mechanisms 30, 34, and 38 causes programmable transistor legs 22 and 26 to deactivate and programmable transistor leg 24 to activate.

When a given programmable transistor leg is activated, the switching mechanism contributes a small resistance but does not change the amount of current flowing through the programmable transistor leg. In the depicted embodiment, selectively activating and deactivating the legs varies the collective width-to-length ratio of the transistor system through which the reference current flows. In other words, activation and deactivation of the reference legs varies the reference side dimensional parameter. This in turn varies the gate voltage which is passed to transistor 42. The gate voltage, together with the width-to-length ratio of transistor 42, determines the amount of output current drawn by transistor 42.

From the above, it will be appreciated that activation of a given reference leg varies the mirroring parameter, due to the variation this produces in the reference side dimensional parameter. The effect on the mirroring parameter produced by activating a given reference leg typically varies with the size (e.g., width) of the corresponding transistor, relative to the other transistors. As discussed below with respect to various other embodiments of the invention, gain techniques and structures may also be implemented to scale the relative effects of activating a given transistor or group of transistors.

Still referring to FIG. 2, as indicated above, selective activation and deactivation of the programmable transistor legs varies the reference side dimensional parameter. Specifically, the reference side dimensional parameter is the sum of the width-to-length ratios of the activated reference side transistor legs. Typically, the individual width-to-length ratios are scaled according to a binary series (e.g., transistors with relative widths of 1w, 2w, 4w, etc.), though other configurations are possible. Binary scaling on the reference side is convenient because it facilitates providing inverse linear programmability. An inverse linear programmable current mirror is useful when high resolution is required as the output current grows smaller. For example, if:

$$4W_{22}=2W_{24}=W_{26}4W_{40}$$

then the mirroring parameter may be reduced to:

$$M = \frac{1}{n}, 0 < n < 8$$

and, therefor;

$$I_o = \frac{1}{n} \times I_R, 0 < n < 8,$$

where the value of n typically is determined by application of a three bit digital control word, as shown below in Table 1:

TABLE 1

| Digital Control Word | n | M |
|---|---|---|
| 000 | 0 | 1/0 |
| 001 | 1 | 1/1 |
| 010 | 2 | 1/2 |
| 011 | 3 | 1/3 |
| 100 | 4 | 1/4 |
| 101 | 5 | 1/5 |
| 110 | 6 | 1/6 |
| 111 | 7 | 1/7 |

As an alternative to the above arrangement, a thermometer-encoded control word may be used in connection with multiple transistor legs having equal width-to-length ratio. In such a case, assuming each programmable leg has a width-to-length ratio equal to $W_{40}$, the value of n from the above example could still be varied linearly from 0 to 7 by using the thermometer-encoded control word to control the number of activated transistors. Activating transistors causes n to equal 0, activating one transistor cause n to equal 1, activating two transistors causes n to equal 2, and so on. Thermometer encoding is when a monotonically changing current is needed even though process non-uniformities may cause the width-to-length ratios to deviate from their designed targets. Thermometer encoding, digital encoding, and the other control word techniques discussed herein may be applied to any of the embodiments of the present invention.

Operation of a current mirror when every transistor leg of the reference system is deactivated may not be useful. As described above, the divisor of the mirroring parameter typically is the dimensional parameter associated with the reference system, which in turn is the sum of the width-to-length ratios of each activated transistor leg of the reference system. If no transistor legs are activated, the sum is zero and the mirroring parameter is an undefined value. FIG. 3 shows an embodiment of the present invention configured to prevent situations where the mirroring parameter is undefined. Current mirror 44 includes a fixed transistor leg 46 configured for persistent activation. Fixed transistor leg 46 typically does not include a switching mechanism or alternatively includes a switching mechanism that is always activated. Therefore fixed transistor leg 46 is not responsive to a control word. As a result, the width contribution from the fixed transistor leg prevents the mirroring parameter from being an undefined value. In addition, the fixed transistor leg may be used to alter the mirroring parameter and/or the coding of a control word. For example, a fixed transistor leg may be used to effectively add n=1, 2, 3, etc. to the control word. It should be understood that when n=0 the output current will be large, but may be limited by circuits outside of the mirror.

FIG. 4. shows a programmable current mirror in which the reference system and the mirror system both include programmable transistor legs. In many implementations, it will be desirable to scale the transistor legs according to a binary series. For example, if:

$$4W_{50}=2\ W_{52}=W_{54}=4W_{56}=W_{58}=2W_{60}=4W_{62}$$

then the mirroring parameter may be reduced to:

$$M = \frac{m}{n+1}, \begin{matrix} 0 < m < 8 \\ 0 < n < 8 \end{matrix}$$

and, therefore:

$$I_o = \frac{m}{n+1} \times I_R, \begin{matrix} 0 < m < 8 \\ 0 < n < 8 \end{matrix}$$

where the values of m and n are typically determined by application of a six bit digital control word as shown below in Table 2:

TABLE 2

| Last Three Bits of Digital Control Word | | | 0 | 0 | 0 | 0 | 1 | 1 | 1 | 1 |
|---|---|---|---|---|---|---|---|---|---|---|
| | | | 0 | 0 | 1 | 1 | 0 | 0 | 1 | 1 |
| | | | 0 | 1 | 0 | 1 | 0 | 1 | 0 | 1 |
| | | m | 0 | 1 | 2 | 3 | 4 | 5 | 6 | 7 |
| First Three Bits of Digital Control Word | n | M | | | | | | | | |
| 000 | 0 | | 0/1 | 1/1 | 2/1 | 3/1 | 4/1 | 5/1 | 6/1 | 7/1 |
| 001 | 1 | | 0/2 | 1/2 | 2/2 | 3/2 | 4/2 | 5/2 | 6/2 | 7/2 |
| 010 | 2 | | 0/3 | 1/3 | 2/3 | 3/3 | 4/3 | 5/3 | 6/3 | 7/3 |
| 011 | 3 | | 0/4 | 1/4 | 2/4 | 3/4 | 4/4 | 5/4 | 6/4 | 7/4 |
| 100 | 4 | | 0/5 | 1/5 | 2/5 | 3/5 | 4/5 | 5/5 | 6/5 | 7/5 |
| 101 | 5 | | 0/6 | 1/6 | 2/6 | 3/6 | 4/6 | 5/6 | 6/6 | 7/6 |
| 110 | 6 | | 0/7 | 1/7 | 2/7 | 3/7 | 4/7 | 5/7 | 6/7 | 7/7 |
| 111 | 7 | | 0/8 | 1/8 | 2/8 | 3/8 | 4/8 | 5/8 | 6/8 | 7/8 |

It should be understood that any number of transistor legs may be used in either the reference system or the mirror system. The number of transistor legs in the reference system may be the same as or different than the number of transistor legs in the mirror system.

Control words used to control a current mirror as described above typically include one bit for every programmable transistor leg included in the current mirror. However, it should be understood that more than one control word may be used to control a current mirror configured in accordance with the present invention. For example, one control word mat be reference system while another control word controls the mirror system. In another example, one control word may control one transistor group of the reference system while another control word controls another transistor group of the reference system. Plural control words may also be used to control plural transistor groups of the mirror system. A control word may also include extra bits that do not control activation of a transistor leg. It should also be understood that other control mechanisms are possible. For example, thermometer encoding may be used as discussed above with reference to FIG. 2.

As discussed above, control over the mirroring parameter may be achieved by configuring a current mirror with transistor legs of various width-to-length ratios. In addition, the gate voltages of the various transistors may be scaled to vary the relative effect on the mirroring parameter produced by activating the transistors. In this way, two transistor legs with the same width-to-length ratio may draw different amounts of current, and as a result, upon selective activation, alter the mirroring parameter by different factors. In other words, individual transistor legs may have an effective width-to-length ratio that is influenced by voltage and/or current scaling features employed in the circuit design. The effective width-to-length ratio may be thought of as the actual width-to-length ratio that would be required to produce the same effects to the mirroring parameter were voltage/current scaling not used. The effective width-to-length ratio may be smaller or larger than that actual width-to-length ratio. Gate voltages may be scaled for individual transistor legs or groups of transistor legs. The current mirror embodiments of the present invention which employ these scaling features may be referred to as multistage programmable current mirrors, as will be explained below.

FIG. 5 is a block diagram depicting a multistage current mirror 64 according to the present invention. As with the previous embodiments, current mirror 64 includes a reference and mirror systems each have subsystems which typically include one or more switchable transistor legs as described above. As before, the relationship between the output current and the reference current is defined by mirroring parameter M. Current mirror 64 additionally includes a gain feature, which enables the system to scale effects upon the mirroring parameter produced through operation of the various different reference and mirror subsystems.

Specifically, reference system 66 includes gain circuit 74 that is operatively connected to reference subsystems 76 and 78. Gain circuit 74 is configured to relatively scale the effects on the mirroring parameter produced through operation of the programmable mechanisms associated with the two reference subsystems. Typically, this is implemented by scaling the gate voltages so that the gate voltage applied to reference subsystem 76 differs from that applied to subsystem 78.

Designing inverse multistage systems such as that shown in FIG. 5 is significantly complicated by feedback effects occurring on the reference side of the system. The portion of the reference current drawn through the transistors of reference subsystem 78 affects the gate voltage of those transistors. The gate voltage on subsystem 78 in turn affects the gate voltage on subsystem 76 via operation of gain circuit 74, which in turn affects the current drawn by subsystem 76. Variation of the current through subsystem 76 affects the portion of the reference current drawn through 78. In other words, applying the reference current to the reference system produces effects at the individual reference subsystems (i.e., gate voltages), and these effects are not independent of one another. To the contrary, the subsystem gate voltages affect each other, which affects the portion of the reference current flowing through each subsystem, which affects the gate voltages, and so on. Each reference subsystem influences operation of the other reference subsystems. By contrast, on the mirror (output) side 68, the gate voltages produce effects (i.e. drawn currents) which are substantially independent of one another, as explained below.

Referring still to FIG. 5, although reference system 66 is depicted with one gain circuit 74 and two reference subsystems (76 and 78), it should be understood that any number of gain circuits and/or reference subsystems may be used in accordance with the present invention. Gain circuits typically scale the effect of the subsystems by scaling the gate voltages on either side of the gain circuit to thereby scale the portion of the reference current drawn by the subsystems. Because of this gain effect, a transistor leg included in subsystem 76 may alter the mirroring parameter by a different amount than a transistor leg included in subsystem 78, even where the two transistor legs have the same width-to-length ratio. Gain effects will of course also occur where the two transistor legs have different width-to-length ratios. In this case, the different effect upon the mirroring parameter arises due to differences in the device geometry, and due to scaled biasing conditions caused by operation of the gain circuit.

Mirror system 68 includes a gain circuit 80 that is operatively connected to mirror subsystem 82 and 84. Similar to gain circuit 74, gain circuit 80 is configured to scale the effects that programmable variation of the mirror subsystem has on the mirroring parameter. It should be understood that any number of gain circuits and/or mirror subsystems may be used in accordance with the present invention. Similarly, it should be understood that two or more gain circuits may be operatively connected and interposed between any two subsystems just as any two or more subsystems may be operatively interposed between two gain circuits.

Multistage configurations on the mirror side typically do not produce the feedback complications that can occur on the mirror side with inverse multistage configurations. Referring specifically to mirror system 68, the gate voltage applied to subsystem 82 determines the amount of current drawn by the transistor(s) in that subsystem. Subsystem 84 receives a reduced gate voltage, via operation of gain circuit 80. This reduced gate voltage means that the maximum amount of current that can be drawn by subsystem 84 is less than the maximum amount of current that can be drawn by subsystem 82, assuming the groups have equivalent overall width-to-length ratios. However, the current drawn by subsystem 82 does not affect the gate voltage applied to subsystem 84, and thus does not affect the current drawn by subsystem 84. The independence between the effects produced by the different gate voltages (i.e., drawn currents) simplifies the mirror side design.

Figure 6:
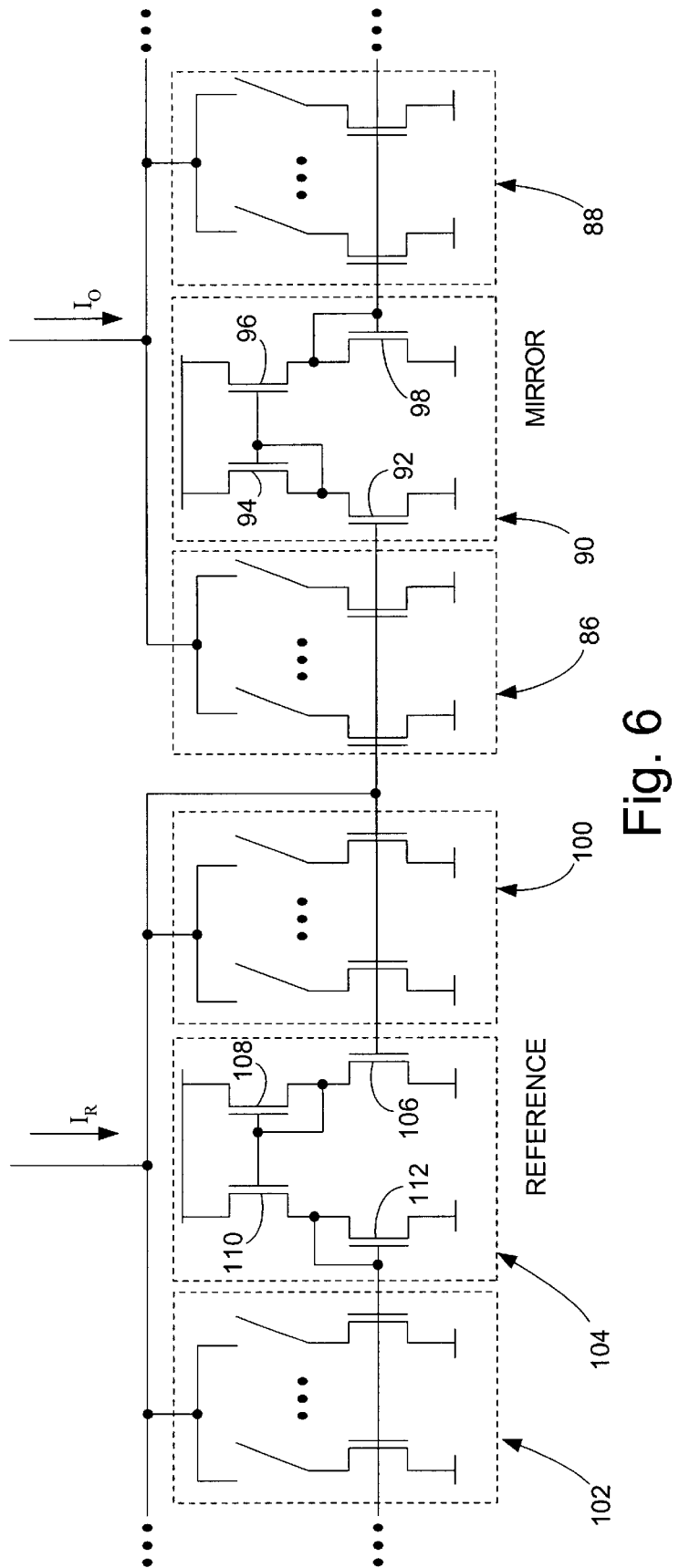
FIG. 6 depicts a rational multistage programmable current mirror according to the present invention.

FIG. 6 shows another illustrative embodiment of the present invention. The depicted programmable current mirror includes gain circuits configured to scale effects produced upon the mirroring parameter by programmable variation of transistor groups. The mirror system includes plural transistor groups, two of which are depicted as 86 and 88, and an interposed gain circuit 90. Alternatively, the mirror system may include any appropriate number of transistor groups and gain circuits. Typically, as indicated, each adjacent pair of transistor groups has an associated interposed gain circuit, such as gain circuit 90, though other configurations may be employed. In many cases, it will be desirable that the different transistor groups are identical to one another, although it may be useful to implement transistor groups having different configurations.

Gain circuit 90 operates to scale the gate voltages of transistor group 88 relative to the gate voltages of transistor group 86, which in turn scales the currents that are drawn through the groups in response to switching operations. In the depicted embodiment, gain circuit 90 includes two fixed current mirrors, though other gain devices and methods may be used to improve accuracy. In gain circuit 90, transistor 92 pulls a current which mirrors the current flowing through an equivalently sized active transistor leg in transistor group 86. Transistors 94 and 96 act as a current mirror, so that the current flowing through transistor 96 is some fixed ratio of that flowing through transistor 92, and therefore a fixed ratio of the current flowing through transistor group 86. Transistor 98 acts as the reference side of a second current mirror for transistor group 88 so that the current pulled by any activated transistor leg of transistor group 88 is a fixed ratio of the current pulled by the analogous activated transistor leg of transistor group 86. The net result is that transistor group 88 may pull a factor less current than transistor group 86, even if transistor groups 86 and 88 are switched to states in which they have identical collective width-to-length ratios.

In FIG. 6, the reference system includes plural transistor groups, two of which are depicted as 100 and 102, and an interposed gain circuit 104. As with the mirror side, the depicted configuration is intended to be illustrative only, and many other configurations are possible. Gain circuit 104 operates similar to gain circuit 90, in order to scale the gate voltages experienced at transistor groups 100 and 102. Typically, gain circuits 90 and 104 are implemented as gain-reducing devices so as to scale down the gate voltages and associated currents from the levels existing at reference side transistor group 100 and mirror side transistor group 86. Specifically, gain circuit 104 typically is configured so that the gate voltages on group 102 are lower than the gate voltages on group 100. Similarly, gain circuit 90 typically is configured so that the gate voltages on group 88 are lower than the gate voltages on group 86.

Typically, each transistor group will include three transistor legs, which each include a switching mechanism and a transistor. However, it should be understood that any number of transistor legs may be used within a given transistor group. The transistor groups are associated with a dimensional parameter that may be described by the sum of the width-to-length ratio(s) of each activated transistor leg in that transistor group. Each group also has an effective dimensional parameter due to the operation of the gain circuits. The number of transistor legs included in the current mirror determines how many programmable variations are possible and therefore by how many steps the numerator and denominator of the mirroring parameter may be varied. In other words, increasing the number of transistor legs increases the resolution and/or range of the programming capability of the current mirror. Use of gain circuits, as described above, allows for large range, high resolution programmability without requiring a large range in device sizes.

Figure 7:
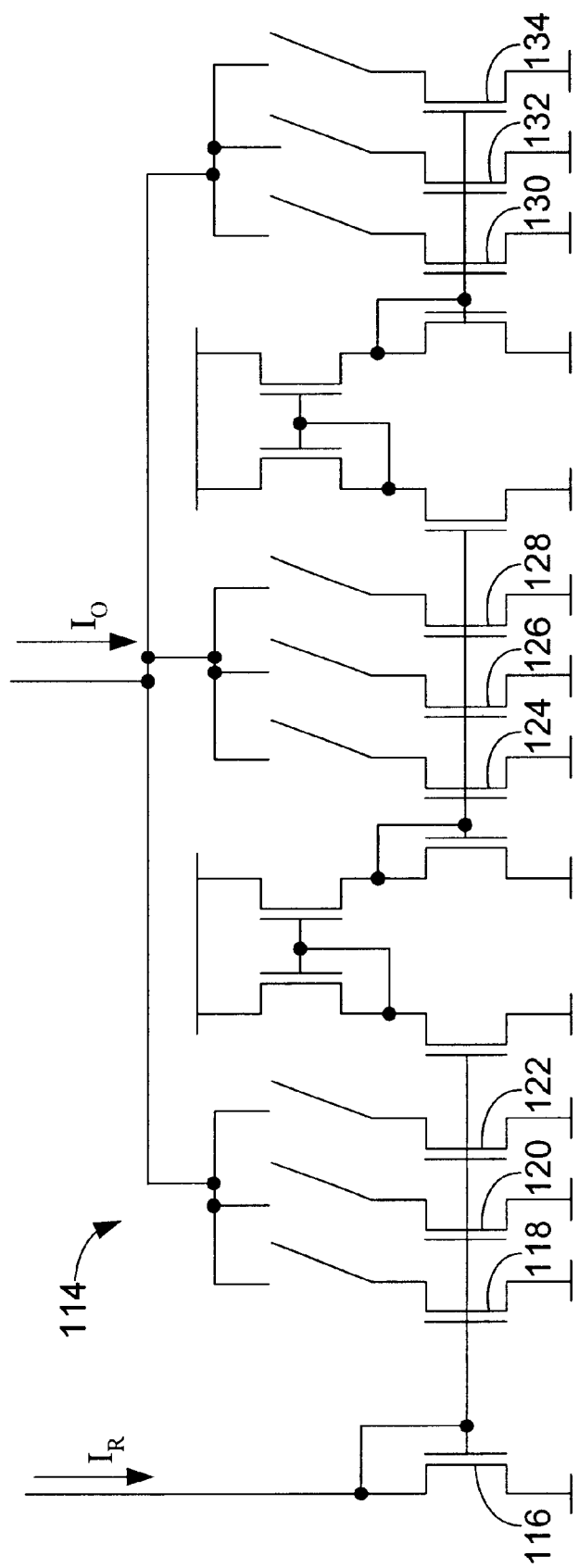
FIGS. 7–9 depict further current mirror embodiments providing non-inverse, inverse and rational programmability.

FIG. 7 shows a multistage linear programmable current mirror 114. The mirror system of current mirror 114 includes three transistor groups, each with three binary scaled transistor legs. Connected between adjacent transistor groups are gain circuits, each configured to step the current down by a factor of eight. The transistors of current mirror 114 are scaled as follows:

$$W_{116}=W_{118}=2W_{120}=4W_{122}=W_{124}=2W_{126}4W_{128}=W_{130}2W_{132}=4W_{134}$$

In the depicted embodiment, if N is a nine bit control word, the most significant bit of which controls the switching mechanism of transistor leg 118, and the least significant bit of which controls the switching mechanism of transistor leg 134, and so on for the intermediate bits, then the mirroring parameter may be reduced to:

$$M = \frac{N}{2^8}, 0 < N < 2^9$$

and, therefor $$I_o = \frac{N}{2^8} \times I_R, 0 < N < 2^9.$$

Thus, a programmable current mirror as depicted may provide a total of nine bits of resolution. In such a configuration, the largest transistor is only four times the size of the smallest transistor. An equivalent single-stage programmable current mirror would require the largest transistor to be 256 times the size of the smallest. The physical realization of a current mirror of the present embodiment is considerably smaller than a single-stage current mirror with nine bits of resolution and a similar range of operation. It should be understood that additional bits of resolution may be added to current mirror 114 by adding additional gain circuits and/or transistor groups, and that such additions will not exponentially increase the physical size of the current mirror.

Figure 8:
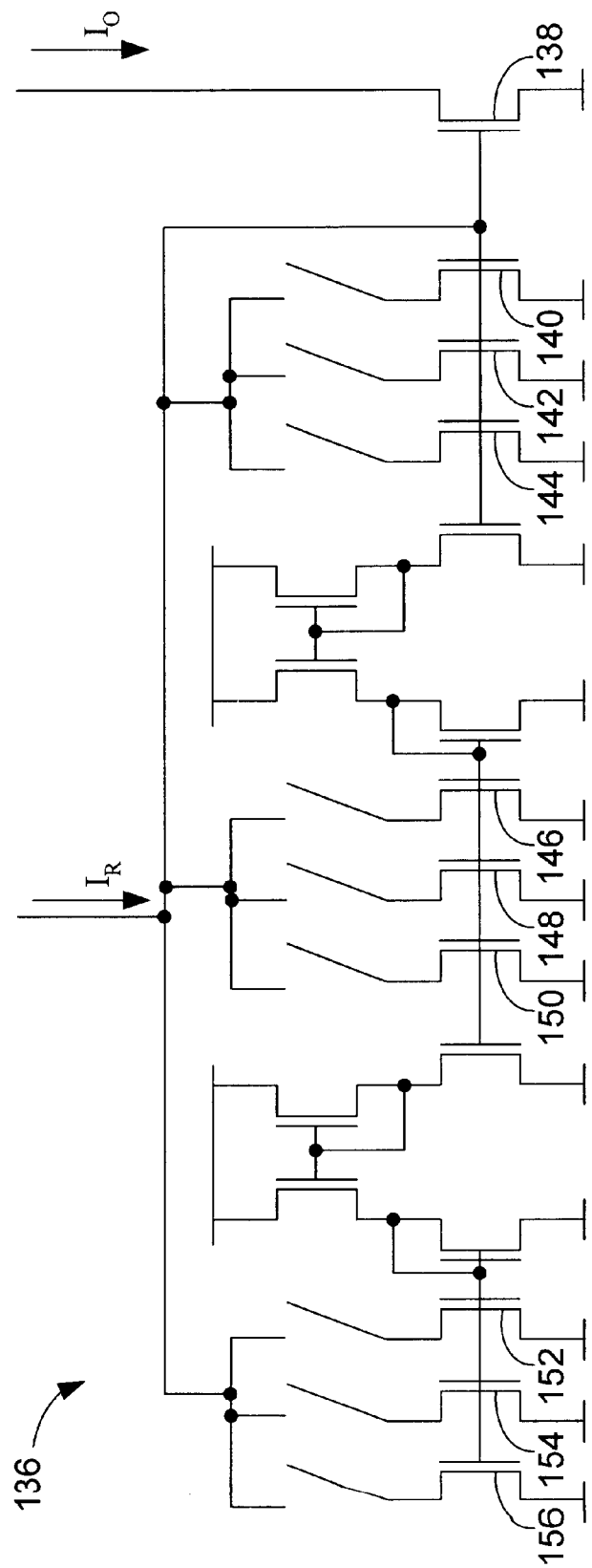

FIG. 8 shows a multistage inverse linear programmable current mirror 136 in accordance with the present invention. The reference system of current mirror 136 includes three transistor groups, each with three binary scaled transistor legs. Connected between adjacent transistor groups are gain circuits, each configured to step the current down by a factor of eight. The transistors of current mirror 136 are scaled as follows:

$$4W_{138}=W_{140}=2W_{142}=4W_{144}=W_{146}=2W_{148}4W_{150}=W_{152}2W_{154}=4W_{156}$$

In the depicted embodiment, if N is a nine bit control word, the most significant bit of which controls the switching mechanism of transistor leg 140, and the least significant bit of which controls the switching mechanism of transistor leg 156, and so on for the intermediate bits, then the mirroring parameter may be reduced to:

$$M = \frac{2^6}{N}, 0 < N < 2^9$$

and, therefore:

$$I_o = \frac{2^6}{N} \times I_R, 0 < N < 2^9.$$

As with the system of FIG. 7, the system shown in FIG. 8 provides nine bits of resolution, but with the programmability affecting the denominator of the mirroring parameter. Also similar to the system of FIG. 7, the largest transistor is only four times the size of the smallest transistor, allowing for a relatively small physical realization of the circuit. Additional bits of resolution may be added as desired by adding gain circuits and/or transistor groups.

Figure 9:
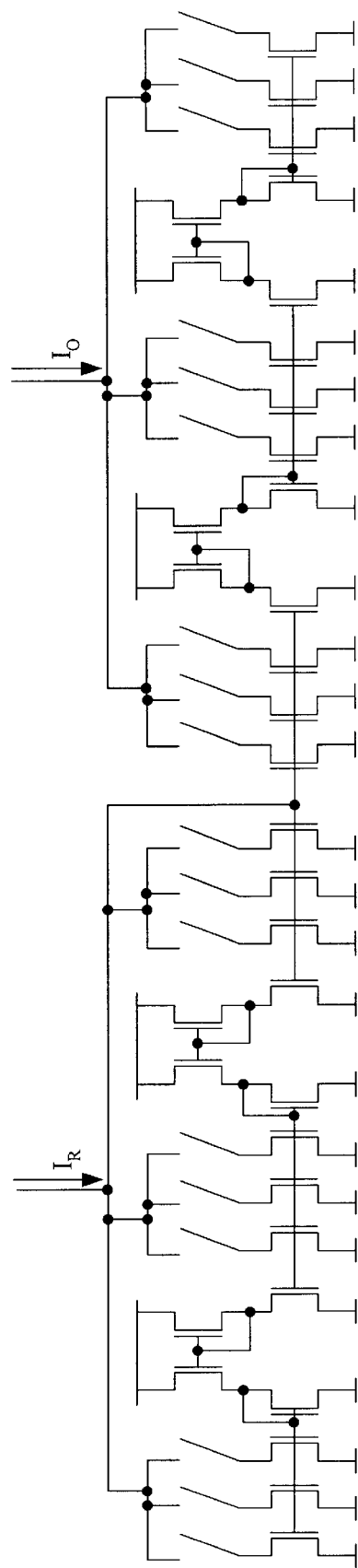

High resolution, rational programmable current mirrors may be constructed by combining multistage programmable mirror systems with multistage programmable reference systems. For example, the mirror system of current mirror 114 may be combined with the reference system of current mirror 136 to produce an eighteen bit multistage rational programmable current mirror, as shown in FIG. 9. Despite the high resolution, the largest transistor of such a current mirror is just four times the size of its smallest transistor. Furthermore, additional resolution may be achieved by adding additional gain circuits and/or transistor groups to the mirror system, the reference system, or both.

The range of operation, as well as the resolution, of current mirrors constructed in accordance with the present invention may be increased by adding additional gain circuits and/or transistor groups to the mirror system, the reference system, or both. In particular, current mirrors including multistage programmable mirror and reference systems typically have a desirably large range of operation and a desirably high resolution. These advantages are obtained in the present invention without large physical realizations of the implementing circuits.

Figure 10:
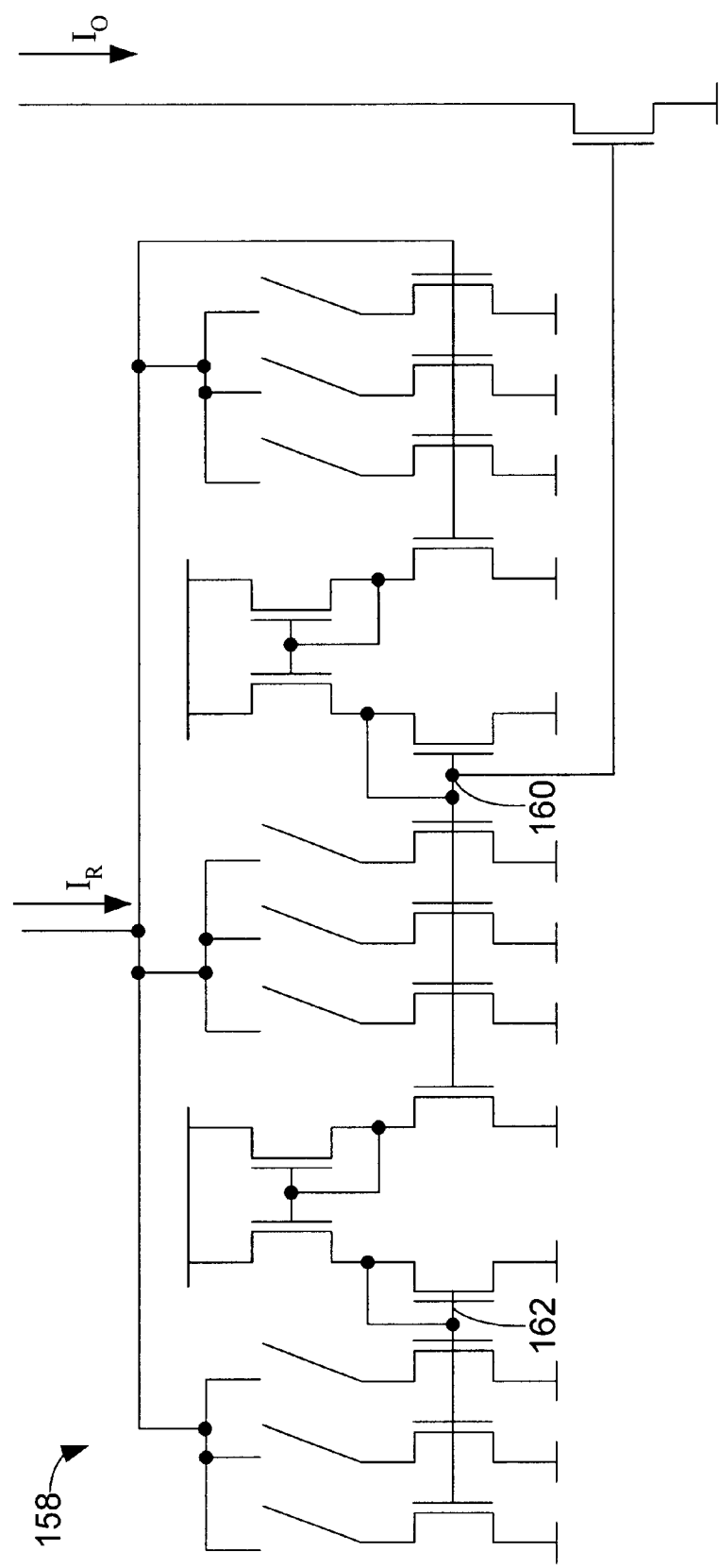
FIG. 10 depicts another multistage programmable current mirror according to the present invention, in which the reference side of the mirror is coupled to the mirror side via an intermediate tap.

FIG. 10 shows a current mirror 158 in accordance with the present invention in which the mirror system is operatively connected to the reference system via a tap interposed between adjacent transistor groups in the reference system. In particular, the connection is at a tapping point 160 of intermediate significance. It should be understood that other connection locations and mechanisms may be used. Changing the location at which the mirror system connects to the reference system changes the mirroring parameter. For example, assuming a transistor configuration identical to current mirror 136 shown in FIG. 8 and described above, current mirror 158 will have a mirroring parameter that may be reduced to:

$$M = \frac{2^3}{N}, 0 < N < 2^9$$

and, therefore:

$$I_o = \frac{2^3}{N} \times I_R, 0 < N < 2^9.$$

If instead the connection was to a least significant tap 162, the mirroring parameter would be reduced to:

$$M = \frac{1}{N}, 0 < N < 2^9$$

and, therefore:

$$I_o = \frac{1}{N} \times I_R, 0 < N < 2^9.$$

Therefore, the mirroring parameter is dependent on transistor sizing, activation, and scaling as well as the tap location at which the mirror system is connected to the reference system. Moreover, the tap position may be actively switched in response to a control word. To achieve a desired mirroring parameter, it should be understood that sizing, scaling (gain), and/or tap position may be changed.

Figure 11:
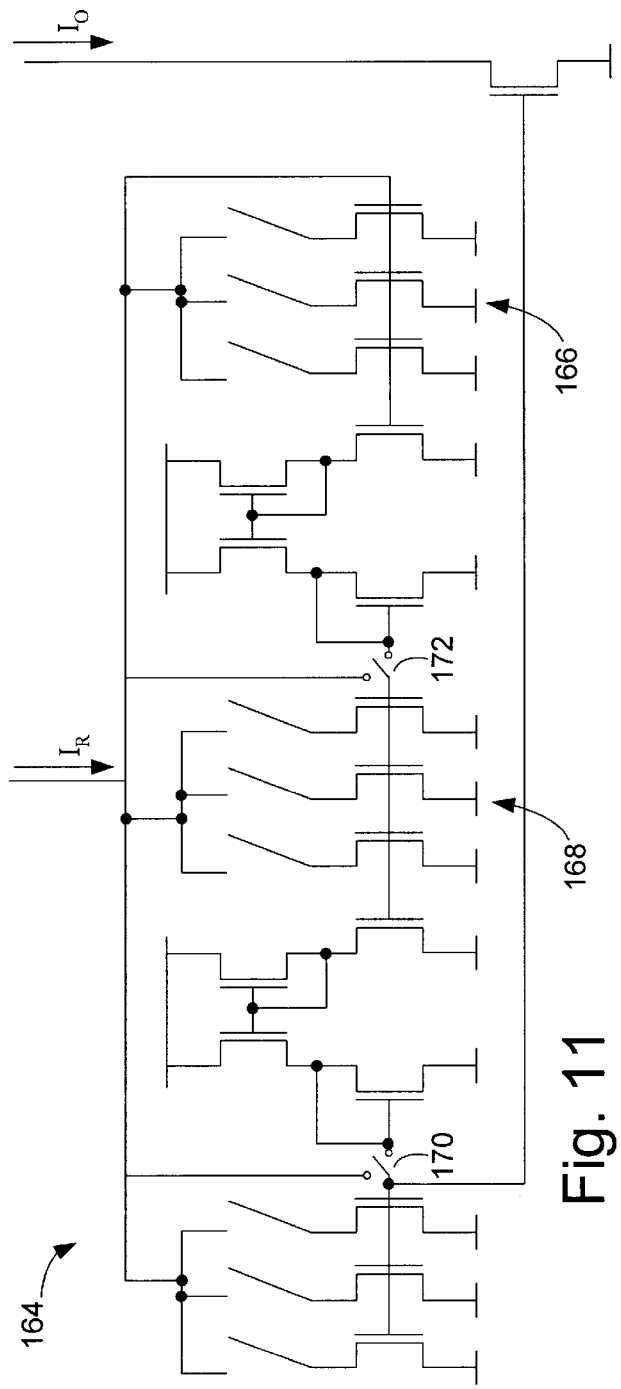
FIG. 11 depicts another multistage programmable current mirror according to the present invention, including an additional switching mechanism configured to allow selective bypass of current mirror stages.

FIG. 11 shows a current mirror 164 in accordance with the present invention. Similar to the other embodiments described above, current mirror 164 may be programmably varied to alter the relationship between the reference current and output current. In particular, if current mirror 164 is implemented with the same transistor configuration as current mirror 136 of FIG. 8, then the mirroring parameter of current mirror 164 may be reduced to:

$$M = \frac{1}{N}, 0 < N < 2^9$$

and, therefore:

$$I_o = \frac{1}{N} \times I_R, 0 < N < 2^9.$$

When N is programmed to a small number, the upper significant bits will be turned off and the corresponding transistor legs will be deactivated. In the depicted embodiment, when $N<2^6$, transistor group 166 will be deactivated. When $N<2^3$, both transistor groups 166 and 168 will be deactivated. In such cases, it is useful to bypass the deactivated transistor groups altogether by the action of switches 170 and 172. Bypassing the more significant transistor groups reduces the voltage at the node where the reference current enters the current mirror, which makes the circuit practical for small to large values of N. The bypass switches for the control groups may be controlled by various mechanisms including a thermometer code derived from a binary representation of the bits of a control word. The thermometer code may be incorporated into the control word used to activate and deactivate transistor legs or may be included in a separate code word of the same or a different type. In particular, the thermometer code may be included in a non-digital code word. Without the mechanism shown in FIG. 11, situations could occur where relatively large gate voltages would have to be applied to group 166 to drive the current mirror. Specifically, referring back to FIG. 8, assuming that no transistors in the right-most transistor groups are activated, obtaining an appropriate gate voltage at transistors 152, 154 and 156 would require a relatively large gate voltage at transistor 140, due to operation of the two depicted gain-reducing stages. The configuration shown in FIG. 11 addresses this by allowing selective bypass of unused transistor groups, so as to bypass operation of unneeded gain circuitry.

Figure 12:
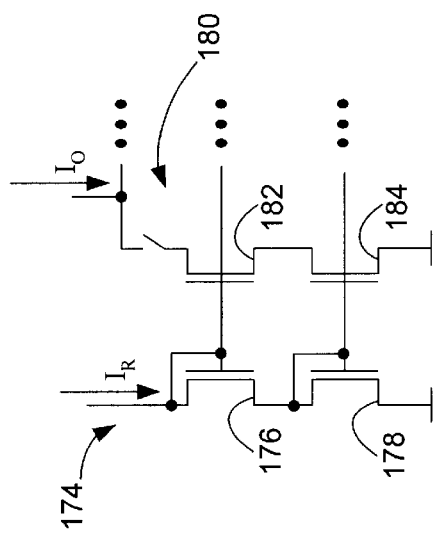
FIG. 12 depicts a cascode arrangement that may be implemented with the programmable current mirrors of the present invention.

The programmable current mirrors of the present invention may be provided with cascoded current mirrors and current sources. FIG. 12 depicts a simple example of this approach in a setting providing non-inverse programmability. Specifically, programmable mirror 174 includes two diode-connected transistors 176 and 178 coupled in cascode fashion on the reference side of the mirror. The output side includes multiple switchable legs, such as switchable leg 180, which includes corresponding cascoded devices 182 and 184. The depicted design may be further extended to include three or more devices coupled in cascode fashion. These cascode configurations may be applied to any of the previously described embodiments of the present invention. Such cascode configurations may be employed to improve accuracy in various current mirror applications.

The current mirrors depicted in the previously described embodiments are constructed primarily from NMOS devices, though it will be appreciated that other semiconductor devices may be employed. For example, in the depicted examples, NMOS transistors may be exchanged for PMOS transistors, and vice versa. Typically, such a modification will also require switching the various circuit connections to the positive supply $V_{ss}$ and negative supply $V_{dd}$.

While the present invention has been particularly shown and described with reference to the foregoing preferred embodiments, those skilled in the art will understand that many variations may be made therein without departing from the spirit and scope of the invention as defined in the following claims. The description of the invention should be understood to include all novel and non-obvious combinations of elements described herein, and claims may be presented in this or a later application to any novel and non-obvious combination of these elements. Where the claims recite "a" or "a first" element or the equivalent thereof, such claims should be understood to include incorporation of one or more such elements, neither requiring nor excluding two or more such elements.

I claim:

1. A programmable current mirror configured to produce an output current based on an applied reference current, where the output current is a product of the reference current and a mirroring parameter, the programmable current mirror comprising:

a reference system configured to receive the reference current; and a mirror system operatively connected to the reference system and configured to output the output current, where the reference system includes a plurality of transistor groups, each transistor group being configured to selectively vary the mirroring parameter via control of current flowing within the transistor group, and where at least one of the transistor groups is operatively connected to a gain circuit configured to scale effects upon the mirroring parameter produced by such transistor group relative to another of the transistor groups.

2. The programmable current mirror of claim 1, where each transistor group includes a switching mechanism configured to vary a dimensional parameter associated with the transistor group, and where variation of the dimensional parameter alters the mirroring parameter.

3. The programmable current mirror of claim 2, where each transistor group includes plural transistor legs coupled in parallel, each transistor leg including a transistor with a width-to-length ratio, each transistor leg being configured for selective activation via the switching mechanism of the transistor group, and where activation of the transistor leg alters the dimensional parameter associated with the transistor group.

4. The programmable current mirror of claim 3, where the dimensional parameter associated with each transistor group is a sum of the width-to-length ratios of each activated transistor leg within the transistor group.

5. The programmable current mirror of claim 3, where at least one of the transistor groups includes transistors with differing width-to-length ratios.

6. The programmable current mirror of claim 3, where at least one of the transistor groups includes transistors with binary scaled width-to-length ratios.

7. The programmable current mirror of claim 3, where the switching mechanism includes plural switching transistors, each switching transistor configured to selectively activate a corresponding transistor leg.

8. The programmable current mirror of claim 7, where each switching transistor is responsive to a bit of a control word.

9. The programmable current mirror of claim 2, where the switching mechanism is controlled via application of a digital control word.

10. The programmable current mirror of claim 2, where the switching mechanism is controlled via application of a thermometer-encoded control word.

11. The programmable current mirror of claim 1, where the gain circuit includes at least one current mirror.

12. The programmable current mirror of claim 1, where the gain circuit is operatively interposed between adjacent transistor groups.

13. The programmable current mirror of claim 1, where the reference system includes a fixed transistor leg configured for persistent activation.

14. The programmable current mirror of claim 1, where the mirror system is operatively connected to the reference system via a tap interposed between adjacent transistor groups included in the reference system.

15. The programmable current mirror of claim 14, where the tap connects to the reference system at a tapping location that is selectively controllable via operation of a switching mechanism.

16. The programmable current mirror of claim 1, where at least one of the transistor groups may be selectively bypassed via operation of a bypass switch.

17. The programmable current mirror of claim 1, where at least one transistor group includes a transistor leg having plural transistors coupled in a cascode configuration.

18. A programmable current mirror configured to produce an output current based on an applied reference current, where the output current is a product of the reference current and a mirroring parameter, the programmable current mirror comprising:

a reference system configured to receive the reference current; and a mirror system operatively connected to the reference system and configured to output the output current, where the reference system includes a plurality of transistor groups, each transistor group including a switching mechanism configured to vary a dimensional parameter associated with the transistor group, where variation of the dimensional parameter alters the mirroring parameter by a factor, and where at least one transistor group is operatively connected to a gain circuit configured to scale the factor corresponding such transistor group.

19. The programmable current mirror of claim 18, where each transistor group includes plural transistor legs coupled in parallel, each transistor leg including a transistor with a width-to-length ratio, each transistor leg being configured for selective activation via the switching mechanism of the transistor group, and where activation of the transistor leg alters the dimensional parameter associated with the transistor group.

20. The programmable current mirror of claim 1, where at least one transistor group includes a transistor leg having plural transistors coupled in a cascode configuration.

21. A programmable current mirror configured to produce an output current based on an applied reference current, where the output current is a product of the reference current and a mirroring parameter, the programmable current mirror comprising:

a reference system configured to receive the reference current; and a mirror system operatively connected to the reference system and configured to output the output current, where the reference system includes a plurality of transistor groups, each transistor group being configured to alter the mirroring parameter via programmable variation of a dimensional parameter associated with the transistor group, and where alterations to the mirroring parameter produced by one of the transistor groups are scaled relative to alterations produced by another of the transistor groups.

22. The programmable current mirror of claim 21, where each transistor group includes a switching mechanism configured to vary the dimensional parameter associated with the transistor group.

23. The programmable current mirror of claim 22, where each transistor group includes plural transistor legs coupled in parallel, each transistor leg including a transistor with a width-to-length ratio, each transistor leg being configured for selective activation via the switching mechanism of the transistor group, and where activation of the transistor leg alters the dimensional parameter associated with the transistor group.

24. The programmable current mirror of claim 22, where the switching mechanism is controlled via application of a control word.

25. The programmable current mirror of claim 24, where the control word is thermometer encoded.

26. The programmable current mirror of claim 25, where the transistor groups include transistor legs with equivalent width-to-length ratios, and that are controlled in response to application of the thermometer encoded control word.

27. The programmable current mirror of claim 24, where the control word is digitally encoded.

28. The programmable current mirror of claim 27, where the transistor groups include a plurality of transistor legs having width-to-length ratios that are scaled according to a binary series.

29. The programmable current mirror of claim 21, where the gain circuit includes at least one current mirror.

30. The programmable current mirror of claim 21, where the mirror system is operatively connected to the reference system via a tap interposed between adjacent transistor groups included in the reference system.

31. The programmable current mirror of claim 30, where the tap connects to the reference system at a tapping location that is selectively controllable via operation of a switching mechanism.

32. The programmable current mirror of claim 21, further comprising a bypass switch configured to enable selective bypass of one or more deactivated transistor groups.

33. The programmable current mirror of claim 21, where the mirror system is configured to enable programmable variation of the mirroring parameter.

34. The programmable current mirror of claim 33, where the mirror system includes a plurality of transistor groups, each transistor group being configured to alter the mirroring parameter via programmable variation of a dimensional parameter associated with the transistor group.

35. The programmable current mirror of claim 21, where at least one transistor group includes a transistor leg having plural transistors coupled in a cascode configuration.

* * * * *